United States Patent [19]

Kobus

[11] Patent Number: 4,730,693

[45] Date of Patent: Mar. 15, 1988

[54] MULTICHANNEL LOUDSPEAKER ENCLOSURE

[76] Inventor: Stanislas Kobus, 27, rue Denfert-Rochereau, 91120 Palaiseau, France

[21] Appl. No.: 852,611

[22] Filed: Apr. 16, 1986

[30] Foreign Application Priority Data

Apr. 18, 1985 [FR] France ................................ 8505867

[51] Int. Cl.[4] ................................................ H05K 5/00

[52] U.S. Cl. ..................................... 181/145; 181/199

[58] Field of Search ............... 181/144, 145, 147, 171, 181/172, 199; 179/146 E; 381/87–90

[56] References Cited

U.S. PATENT DOCUMENTS

| | | | |
|---|---|---|---|
| 2,826,260 | 3/1958 | Miller | 181/145 |
| 3,819,006 | 6/1974 | Westlund | 181/145 |
| 4,014,597 | 3/1977 | Griffin, Jr. | 181/199 X |
| 4,276,446 | 6/1981 | Taddeo | 381/88 |
| 4,312,420 | 1/1982 | Gatti | 181/199 X |
| 4,408,678 | 10/1983 | White, Jr. | 181/199 |

*Primary Examiner*—Benjamin R. Fuller

*Attorney, Agent, or Firm*—Stiefel, Gross & Kurland

[57] ABSTRACT

The multichannel loudspeaker enclosure of the invention comprises an inner part which is realized taking into account only the mechanical and electroacoustical performance of the sound reproduction elements and which consists of a metal framework defining one cell per channel, with a single module being arranged in each cell an being elastically attached to said framework, each module being suspended in its cell by means of two cables in such manner that said module can move like a pendulum in the direction of the axis of the loudspeaker contained in said module.

7 Claims, 4 Drawing Figures

Figure 4:
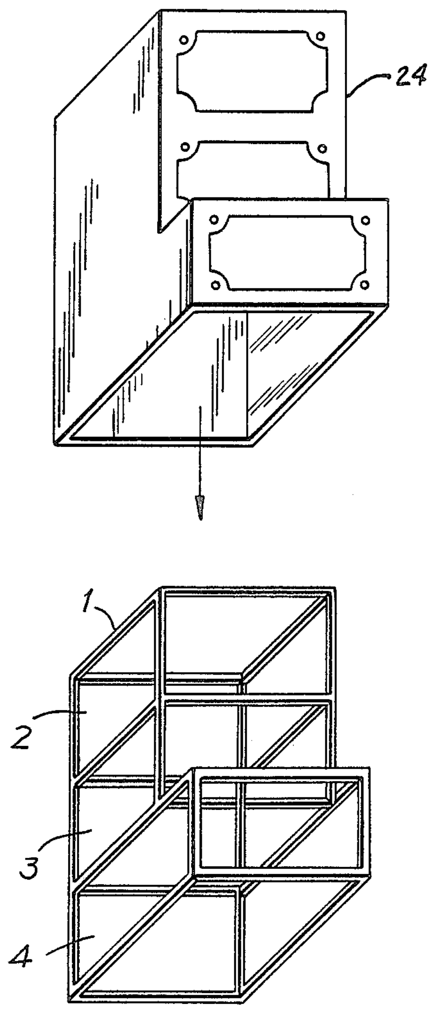

F/G. 1
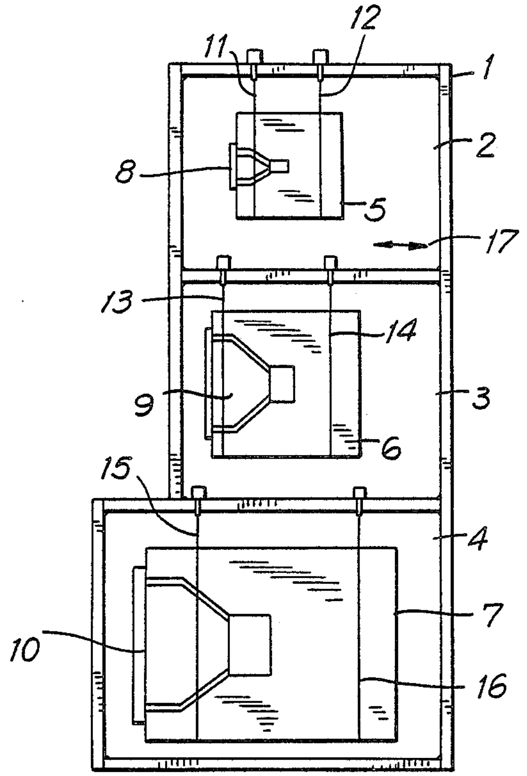
F/G. 2
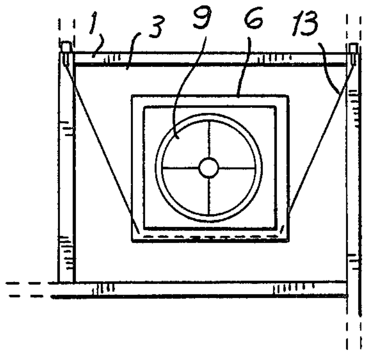
F/G. 3
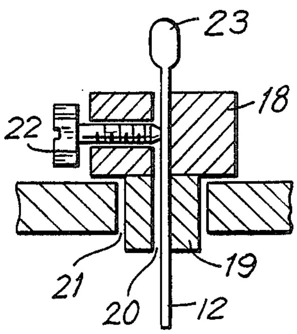

MULTICHANNEL LOUDSPEAKER ENCLOSURE

This invention relates to a multichannel loudspeaker enclosure. It applies to all sound reproduction systems, more particularly to high-fidelity units.

In high-fidelity units now commercially available, the reading devices—such as turntables with a tangential pick-up arm, magnetic-tape readers and, since recently, laser reproduction turntables—and the amplification and correction devices have reached a quality standard that is quite satisfactory. This is not always true as regards the terminal stage constituted by the loudspeaker enclosures.

The walls of loudspeaker enclosures are practically always liable to vibrations that distort the reproduction of sound performed by the loudspeakers included in the enclosures. This defect is known as coloration.

These wall resonances are induced by vibration forces having two main sources.

First, the motive force that controls the diaphragm vibrations of each loudspeaker in order to produce sound is transmitted, by reaction, to the body of the loudspeaker and to its points of attachment to the enclosure. The force spreads to all the enclosure walls by the effect of conductivity.

Further, the air pressure fluctuations occurring within an enclosure as a result of the rear sound wave produced by each loudspeaker generate distributed forces that act directly on all the walls.

Because of the large area of the enclosure walls compared with the small area of the loudspeaker diaphragms, even vibrations of very small amplitude alter considerably the characteristics of the reproduced sound.

The resulting quality degradation in the reproduction of sound is further increased by the trailing effect of the vibrations, that is, the time of their persistence—which varies with the damping coefficient of the materials involved—after the excitation that generated them has disappeared. Thus, in music passages where sounds vary quickly in pitch and intensity, some sounds, hence some notes, are masked by trailing interfering vibrations that were generated during the reproduction of the preceding sounds. This results in a woolly-effect in the reproduction of sound, with poor fidelity of the quality of the instrument tones and poor stereophonic location.

In addition to such undesired vibrations of the enclosure walls, the loudspeakers themselves behave unsatisfactorily, vibrating along with the walls and acting the ones on the others. Then, the body of each loudspeaker no longer represents the fixed reference with respect to which the diaphragm has theoretically to move. This causes detrimental effects including a reduction of dynamics, the occurrence of crossmodulation and the creation of diaphragm resonances in frequency ranges where the diaphragm is not supposed to be operated.

It is therefore desirable to design a loudspeaker enclosure that will avoid the generation of spurious vibrations therein or, at least, that will substantially limit the amplitude of such vibrations. as is well known, said amplitude depends mainly on the mass, the stiffness and the damping coefficient of the materials employed. Ideally, loudspeaker en closures should therefore be constructed with very heavy and perfectly stiff materials with additionally a high damping coefficient. This, however, is hardly compatible with the requirements of easy manufacture and transport, not forgetting the aesthetics of the final product.

The purpose of the invention is therefore to provide a loudspeaker enclosure that will avoid the above-mentioned disadvantages.

One particular feature of the loudspeaker enclosure according to the invention is that the inner part of the enclosure comprises one distinct module for each loudspeaker, each module being flexibly connected to a supporting framework laid on the floor. The aesthetic outline of the enclosure is obtained in an absolutely independent manner owing to an external housing.

The various objects and features of the invention will now be described in detail in an embodiment given only by way of non-limiting example, with reference to the accompanying drawings which represent:

FIG. 1, a schematic side view of the inner part of a loudspeaker enclosure designed in accordance with the invention;

FIG. 2, a schematic front view of the middle module in FIG. 1;

FIG. 3, an example of embodiment of an attachment and adjustment device for the module suspending cables as shown in FIG. 1.

FIG. 4 illustrates the framework and cabinet of the loudspeaker enclosure of the invention.

Referring now to FIGS. 1 and 2, there is going to be described an example of embodiment of the inner part of a three-channel loudspeaker enclosure using electrodynamic loudspeakers and designed according to the invention.

The arrangement shown in FIG. 1 consists of a framework (1), possibly made from metal section bars, which delimit three cells (2, 3, 4). Inside each one of the three cells there is arranged a module (5, 6, 7), each including a single loudspeaker (8, 9, 10). Within its cell, each module is suspended by means of two thin cables (11-12, 13-14, 15-16), made preferably of steel, in such manner that the module will be able to move like a pendulum in the direction of the axis of the corresponding loudspeaker, as shown by arrow 17 in FIG. 1.

This way, no vibration resulting from the axial electro-magnetic force that drives the loudspeaker diaphragm can be transmitted to the framework (1), hence to the other modules. The vibrations of the walls as a result of air pressure fluctuations within the module are symmetrical with respect to the other two axes normal to the loudspeaker axis. These vibrations counterbalance one another and their resultant effect is nil.

Each module is made of a specific material or combination of materials, Its dimensions are chosen in consideration of its field of application, more particularly of the range of frequencies of the sounds the loudspeaker contained therein is expected to reproduce. The material is so chosen that its mass and stiffness in combination with the dimensions of the module will determine the resonance frequencies of the module to lie outside said range of frequencies of the sounds to be reproduced. This way, said resonance frequencies cannot be excited.

The module suspension method enables positioning each module optimally in relation to the other modules, hence solving the electroacoustic problems encountered in loudspeaker enclosures of known types. The suspension method makes it possible to adjust the height and orientation of each module so as to optimize the acoustic radiation lobes. Each module can also be adjusted in depth so as to obtain an aggregate phase coherence between the loudspeakers.

Such position adjustments are critical in high-grade loudspeaker enclosures however, they cannot obviously be achieved easily in known-type enclosures where the cabinet is used as the loudspeaker supporting structure.

In the diagram of FIG. 3, there is shown an example of embodiment of an attachment and adjustment device for the steel cables designed to suspend the modules shown in FIGS. 1 and 2.

The device of FIG. 3 consists of a metal piece (18) cylindrical in shape, with its lower part being extended by another cylindrical, concentrical piece (19) of smaller outside diameter, i.e. about half the outside diameter of the upper part (18). The aggregate block includes a central bore (20).

The smaller diameter cylindrical part (19) is inserted into a hole provided in the relevant cross-piece of the framework (1). The steel cable (12) is threaded through the central bore (10) where it is held in correct position by means of a radial tightening screw (22).

The other end of the suspension cable is attached the same way. Once the required adjustments have been made, the length of cable that protrudes beyond the top of the cylindrical part (18) is cut a few millimeters above said part (18). For obvious reasons of reliability, the remaining top length of cable is provided with a bulging end of larger diameter than the diameter of the bore (20). The bulging end can be obtained, e.g., by means of a soldering point (23).

As can be seen from FIG. 4, the loudspeaker enclosure according to the invention also includes an external part or cabinet (24) having its inner walls covered with an absorbing material. The purpose of this material, which may be felt, is to attenuate any possible residual radiation from the inner part walls (FIGS. 1 and 2).

According to a preferential embodiment of the invention, the cabinet (24) is manufactured separately and, once completed, it is slipped over the metal framework (1) from the top, in the manner of a hood.

Owing to this procedure, and quite independently of any technical consideration—whether mechanic or electroacoustic—in achieving the inner part (FIGS. 1 and 2), the cabinet can be chosen only in terms of its aesthetical appearance, thus allowing finally an acoustic baffle that will match its environment while offering optimal sound reproduction qualities.

It is to be understood that the foregoing description has been given only as an unrestrictive example and that many other embodiments may be considered without departing from the scope of the invention.

I claim:

1. A loudspeaker enclosure comprising:
   - a framework comprised of a plurality of horizontal and vertical members, said vertical members maintaining said horizontal members in spaced apart relation for defining a plurality of cells between said horizontal members;
   - a module disposed in each cell, each module comprising a loudspeaker and a housing supporting said loudspeaker; and
   - means for supporting said modules on the framework for relative movement of each module independently of the other modules and of said framework.

2. The loudspeaker enclosure according to claim 1, wherein each module is made of a material or a combination of materials chosen in consideration of the dimensions of the module and of the range of frequencies of the sounds to be reproduced by its respective loudspeaker such that the resonance frequencies of the module lie outside said range of frequencies of the sounds to be reproduced so that said resonance frequencies are not excited.

3. The loudspeaker enclosure according to claim 1, wherein said supporting means comprises means for elastically securing said modules to said framework.

4. The loudspeaker enclosure according to claim 3, wherein said means for elastically securing said modules to said framework comprises two cables securing each module to said framework in its respective cell for pendulum-like movement of said module in the direction of the axis of its respective loudspeaker.

5. The loudspeaker enclosure according to claim 1, and further comprising a cabinet dimensioned to fit about said framework, said cabinet having an open end for fitting said cabinet over said framework.

6. The loudspeaker enclosure according to claim 1, wherein said framework is comprised of metal.

7. The loudspeaker enclosure according to claim 1, wherein said supporting means further comprises means for adjusting the position of each module within its respective cell.

* * * * *